United States Patent [19]
Chodora

[11] Patent Number: 6,147,501
[45] Date of Patent: Nov. 14, 2000

[54] AUTOMATIC CALIBRATION OF A NETWORK ANALYZER

[75] Inventor: Jason A. Chodora, Santa Rosa, Calif.

[73] Assignee: Hewlett-Packard Company, Palo Alto, Calif.

[21] Appl. No.: 08/918,340

[22] Filed: Aug. 26, 1997

[51] Int. Cl.⁷ .................................................. G01R 35/00
[52] U.S. Cl. ........................ 324/601; 324/608; 324/637; 333/263
[58] Field of Search .................................... 324/601, 638, 324/637, 642, 639, 130, 615; 333/263; 73/1.01; 702/85, 90, 120

[56] References Cited

U.S. PATENT DOCUMENTS

| | | | |
|---|---|---|---|
| 4,982,164 | 1/1991 | Schiek | 324/601 |
| 5,548,538 | 8/1996 | Grace et al. | 324/601 |
| 5,578,932 | 11/1996 | Adamian | 324/601 |
| 5,646,536 | 7/1997 | Ishihara | 324/638 |
| 5,661,404 | 8/1997 | Yanagawa et al. | 324/601 |
| 5,715,183 | 2/1998 | Grace et al. | 324/601 |
| 5,748,000 | 5/1998 | Blackham | 324/601 |
| 5,748,506 | 5/1998 | Bockelman | 324/601 |

FOREIGN PATENT DOCUMENTS

| | | | |
|---|---|---|---|
| 4401068 | 1/1994 | Germany | G01R 27/28 |
| 2292464A | 7/1995 | United Kingdom | 324/601 |
| 2315873A | 7/1997 | United Kingdom | 324/601 |

OTHER PUBLICATIONS

Comparison between a vector multiport network analyzer and the national S–parameter measurement: Andrea Ferrero et al. Precision Electromagnetic Measurements, 1994. Digest., Conference on, 1994, pp. 143–144.

An automatic procedure for a calibration of a network analyzer: Krekels, H.–G.; Schiek, B. Precision Electromagnetic Measurements, 1994. Digest., 1994 Conference.

*HP 8712C and HP 8714C RF Network Analyzer User's Guide*, Part No. 08712–90056, available from Hewlett–Packard Company, Oct., 1996, pp. 6–1 through 6–14.

*HP8753D Network Analyzer User's Guide*, Part No. 08753–90257, available from Hewlett–Packard Company, Sep., 1995, pp. 6–37 through 6–44.

*Primary Examiner*—Ernest Karlsen
*Assistant Examiner*—Anjan K. Deb

[57] ABSTRACT

A radio frequency network analyzer connected to a multi-port test set is calibrated. An initial calibration is performed for each test set port in the multi-port test set. The initial calibration is performed by first performing a measurement calibration using calibration standards. The calibration standards are located in a reference plane located outside the multi-port test set. The measurement calibration yields initial calibration coefficients. Also the initial calibration includes measuring electronic standards within the multi-port test set to produce initial measured electronic standards. The initial calibration coefficients and the measured electronic standards are used to generate initial corrected electronic standards.

10 Claims, 6 Drawing Sheets

6,147,501

AUTOMATIC CALIBRATION OF A NETWORK ANALYZER

BACKGROUND

The present invention concerns radio frequency and microwave network analyzers and pertains particularly to automatic calibration of a network analyzer.

A radio frequency (RF) network analyzer system consists of a network analyzer and may include a multi-port test set. The network analyzer integrates a synthesized radio frequency source with built-in couplers for signal separation, a narrow band receiver, a display and a processor.

Measurement calibration is a process that improves measurement accuracy by using error correction arrays during signal processing to compensate for systematic measurement errors. Measurement calibration is also called Cal, accuracy enhancement, and error correction. Measurement errors are classified as random and systematic errors. Random errors, such as noise and connector repeatability are non-repeatable and not correctable by measurement calibration.

Systematic errors, such as tracking and crosstalk, are the most significant errors in most RF measurements. Systematic errors are repeatable and for the most part correctable, though small residual errors may remain. These systematic errors may drift with time and temperature.

Systematic errors are due to system frequency response, isolation between the signal paths, and mismatch in the test setup. Frequency response errors (transmission and reflection tracking) are gain errors that are a function of frequency.

Isolation errors result from energy leakage between signal paths in transmission measurements. This leakage is due to crosstalk. In reflection measurements, the leakage is also due to imperfect directivity. Directivity is the ability of the signal separation devices to separate forward traveling signals from reverse traveling signals.

Mismatch errors result from differences between the port impedance of the device under test (DUT) and the port impedance of the network analyzer. Source match errors are produced on the source (network analyzer RF OUT) side of the DUT; load match errors on the load (network analyzer RF IN) side. If the DUT is not connected directly to the ports the mismatch errors due to cables, adapters, etc. are considered part of the source or load match errors.

The network analyzer has several methods of measuring and compensating for these test system errors. Each method removes one or more of the systematic errors using equations called an error model. Measurement of high quality standards (for example, short, open, load, through) allows the network analyzer to solve for the error terms in the error model. The accuracy of the calibrated measurements is dependent on the quality of the standards used and the stability of the measurement system. Since calibration standards are very precise great accuracy can be achieved.

To perform a transmission calibration, four measurement standards are utilized: for example, an open, a short, a load, and a through cable. The network analyzer measures each standard across a defined frequency band using a pre-defined number of points. The measurement of these standards are used to solve for the error terms in the error model and to remove systematic errors caused by frequency response and source match.

To perform a reflection calibration a one-port calibration is performed using three measurement standards: an open, a short, and a load. The network analyzer measures each standard across a predefined frequency band using a predefined number of points. The measurements of these standards are used to solve for the error terms in the error model and to remove systematic errors caused by directivity, source match and frequency response.

For further information about calibration of network analyzers, see for example, the *HP 8712C and HP 8714C RF Network Analyzer User's Guide*, Part No. 08712-90056, available from Hewlett-Packard Company, October, 1996, pp. 6-1 through 6-14.

Switching test sets can extend the measurement capability of network analyzers from a single pair of ports to multiple ports, and allows measurement of devices under test in the forward and reverse directions. The test sets allow significant increase of throughput when using a network analyzer to test a device by eliminating manual changing of device connections and enabling complete automation of the test process.

However, the addition of a test set after the network analyzer can significantly degrade the raw performance of the network analyzer system. The characteristics of the test set also drift with temperature. Vector error correction allows the system (composed of the network analyzer and test set) to achieve very good performance, but the drift of the test set makes frequent re-calibrations necessary. For some devices multi-port calibrations can take over 30 minutes to perform, and may need to repeated frequently, for example, for every eight-hour shift. This significantly reduces the throughput improvement provided by the switching test set.

In order to reduce the time required for calibration various systems have incorporated some automated features. For example U.S. Pat. Nos. 5,434,511, 5,467,021, 5,537,046, 5,548,221, 5,552,714 and 5,578,932 discuss electronic calibration accessories which perform computer-assisted calibrations with electronic standards, making the calibration process less time-consuming and error-prone. However, when using these electronic calibration accessories it is necessary to manually connect a module to the measurement ports. U.S. Pat. No. 5,587,934 also sets out an electronic calibration module that requires manual connections.

U.S. Pat. No. 5,578,932 sets a technique for including electronic calibration in a multi-port test set. This technique, however, appears to use precision-characterized electronic standards. This does now allow for calibration anywhere other than the network analyzer front panel ports.

U.S. Pat. No. 5,548,538 discloses a technique for including calibrations internal to the network analyzer. This technique involves the addition of a precisely characterized two-port module in front of the test set ports. An error matrix is determined for this two-port module relative to known standards at the test set ports. This error matrix can then be used to calculate the reflection coefficients of the electronic calibration standards inside the two-port module and to enable future automatic calibrations.

However, all of these existing techniques, when applied to a multi-port test set, are still very time consuming and complex when used for a full transmission calibration of a multi-port test set.

SUMMARY OF THE INVENTION

In accordance with the preferred embodiment of the present invention, a network analyzer system is calibrated. For example, the network analyzer system includes a radio frequency network analyzer or a microwave network analyzer. An initial calibration is performed for each test port in the network analyzer system. The initial calibration is performed by first performing a measurement calibration using calibration standards. The calibration standards are located in a reference plane located outside the network analyzer system. The measurement calibration yields initial calibration coefficients. Also the initial calibration includes measuring electronic standards within the network analyzer system to produce initial measured electronic standards. The initial calibration coefficients and the initial measured electronic standards are used to generate initial corrected electronic standards.

After the initial calibration, automatic re-calibrations are performed periodically. When performing the automatic recalibration, the electronic standards within the network analyzer system are measured to produce recalibration measured electronic standards. The recalibration measured electronic standards and the initial corrected electronic standards are used to produce recalculated calibration coefficients.

In the preferred embodiment, the electronic standards include an open, a short and a load. What is meant by an open is a circuit which approximates an open circuit. What is meant by a short is a circuit which approximates a short circuit. What is meant by a load is a circuit which approximates a circuit with a reflection coefficient of zero. The initial calibration coefficients include three reflection error coefficients: directivity (DIR), source match (SM) and reflection tracking (RT). The initial calibration coefficients also include one transmission error coefficient: transmission tracking (TT).

The present invention also works well when the network analyzer system includes a multi-port test set connected to a network analyzer. In this case, the test ports of the network analyzer system are test set ports of the multi-port test set and the electronic standards are housed within the multi-port test set.

Also, in the preferred embodiment, during the initial calibration, hen performing the measurement calibration, measured values (R_RAW) for reflection calibration standards are related to corrected values (R_COR) for the reflection calibration standards in accordance with an error model equation as set out below:

$$R\_RAW = DIR + \frac{R\_COR \times RT}{1 - (SM \times R\_COR)}.$$

Also, during the initial calibration, when performing the measurement calibration, a measured value (T_RAW) for a transmission calibration standard is related to a corrected value (T_COR) for the transmission calibration standard in accordance with an error model equation as set out below:

$$T\_COR = \frac{T\_RAW}{TT \times (1 - SM \times R\_COR)}.$$

In the preferred embodiment, the test set ports are divided into pairs. When performing the measurement calibration in the initial calibration, a first ratio of transmission response of fixtures and cables to the pair port calibration through transmission response is determined. The calibration through transmission response is determined using a calibration through line to electrically connect each pair of test set ports. The transmission response of the fixtures and the cables is determined using the fixtures and the cables to electrically connect together each pair of test set ports. For example, the calibration through line is electronically switched while the fixtures and the cables are physically connected at the reference plane.

When calculating a transmission response error coefficient between a first test set port and a second test set port where the second test set port is paired with a third test set port, the transmission response of an internal calibration through path transmission value between the third test set port and the second test set port is measured. The transmission response of the internal calibration through path transmission value between the third test set port and the second test set port is multiplied by the first ratio and by a second ratio. The first ratio is calculated as set out above. The second ratio is the transmission response between a reflection input of the multi-port test set and the first port to the transmission response between the reflection input of the multi-port test set and the third port.

Also in the preferred embodiment, the multi-port test set includes a reflection input, a transmission output, a plurality of test set ports, a plurality of port lines, a first switching means, a second switching means and a plurality of interfaces. The reflection input is for connection to the network analyzer. The transmission output is for connection to the network analyzer. Each port line is associated with a test set port from the plurality of test set ports. The first switching means connects the reflection input to one of the plurality of port lines. The second switching means connects the transmission output to one of the plurality of port lines. Each interface is associated with a test set port from the plurality of test set ports. A first interface includes a plurality of electronic standards, a test set line to a first test set port associated with the first interface, and a selection means. The selection means selects an electronic standard from the plurality of electronic standards or the test set line to be connected to a first port line from the plurality of port lines. The first port line is associated with the first test set port. One of the electronic standards includes a through transmission line to a second interface from the plurality of interfaces. The second interface is associated with a second test set port from the plurality of test set ports. The second test set port is paired with the first test set port.

The present invention allows for fully automatic calibration which is based on an initial calibration at a plane selected by a user. Additionally, the present invention simplifies multi-port transmission calibrations which can be performed without the requirement of "through" connections between every test set port.

DESCRIPTION OF THE PREFERRED EMBODIMENT

Figure 1:
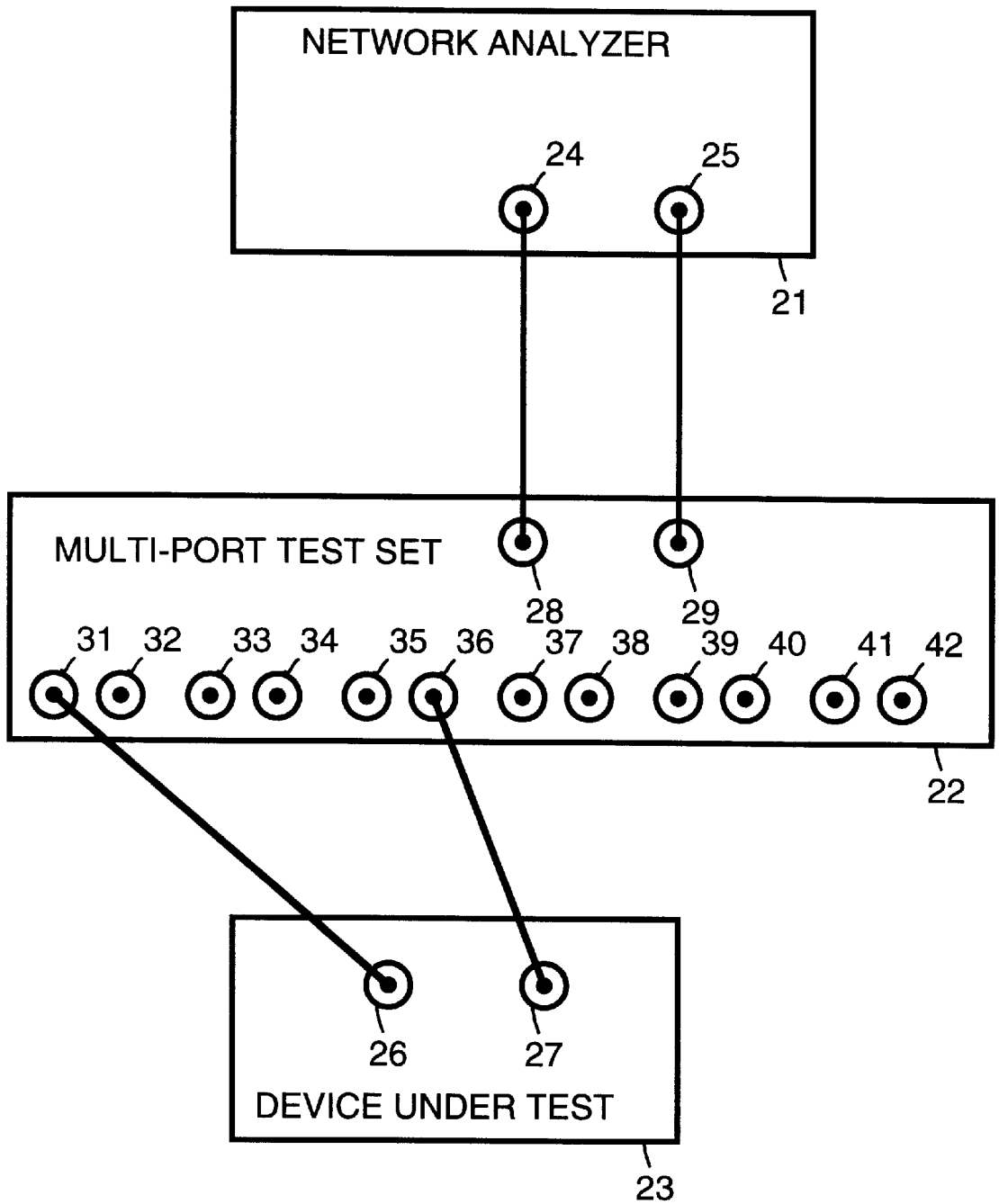
FIG. 1 is simplified block diagram showing connection of a network analyzer to a device under test utilizing a multi-port test set.

FIG. 1 is a simplified block diagram showing a network analyzer system connected to a device under test (DUT) 23. The radio frequency network analyzer system includes a network analyzer 21 connected to a multi-port test set 22. Network analyzer 21 is, for example a radio frequency network analyzer or a microwave network analyzer. The radio frequency network analyzer system is connected to device under test (DUT) 23 utilizing test set ports of multi-port test set 22. DUT 23 has a port 26 and a port 27. Network analyzer 21 has a radio frequency (RF) out port 24 and a radio frequency (RF) in port 25. In order to perform a test, multi-port test set 22 connects a reflection port 28 to one of test set ports 31, 32, 33, 34, 35, 36, 37, 38, 38, 40, 41 and 42. Likewise, in order to perform a test, multi-port test set 22 connects a transmission port 29 to another of test set ports 31, 32, 33, 34, 35, 36, 37, 38, 38, 40, 41 and 42. While multi-port test set 22 is shown with twelve test set ports, multi-port test set 22 can have, for example, four, six, eight or some other number of test set ports.

Figure 2:
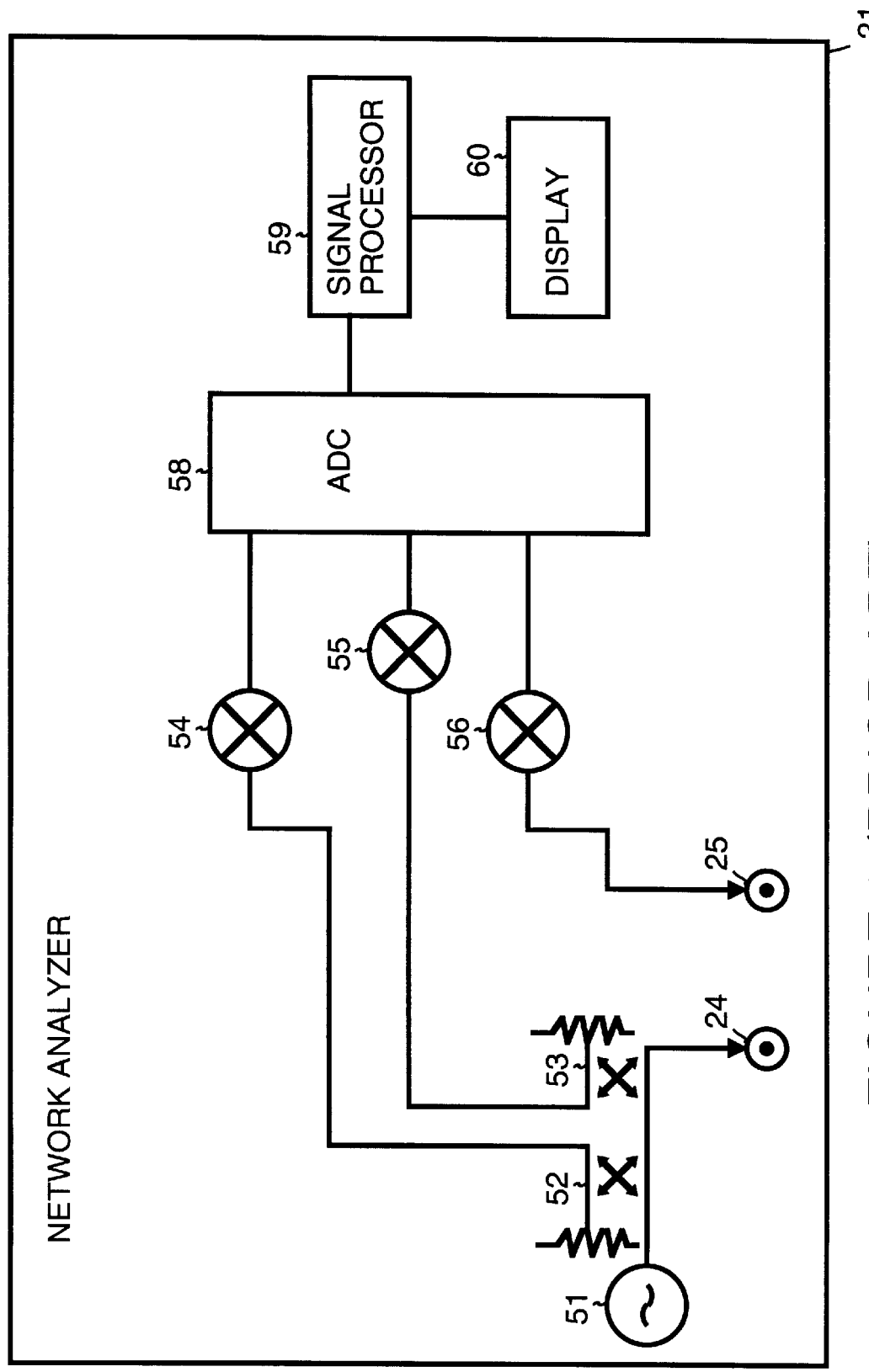
FIG. 2 is a simplified block diagram of a radio frequency network analyzer in accordance with the prior art.

FIG. 2 is a simplified block diagram of radio frequency network analyzer 21 in accordance with the prior art. A radio frequency source 51 provides a radio frequency out signal placed on RF out port 24. The radio frequency out signal is also coupled to a reference signal line 52 and a reflected signal line 53. An analog-to-digital converter (ADC) 58 is connected to a mixer 54, a mixer 56 and a mixer 55. Mixer 55 is connected to reflected signal line 53.

Figure 3:
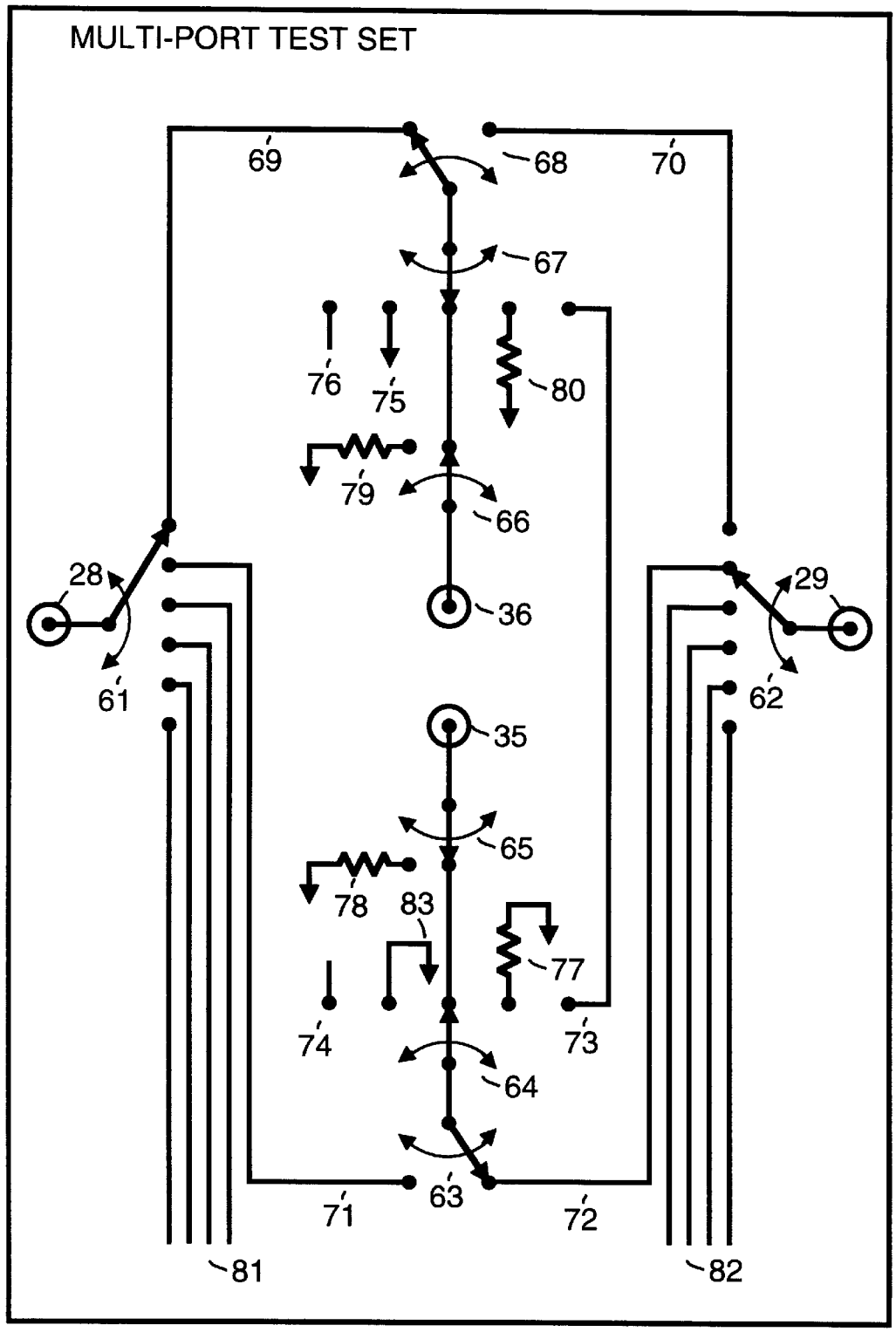
FIG. 3 is a block diagram of a portion of a multi-port test set in accordance with the preferred embodiment of the present invention.

The signals received by analog-to-digital converter 58 are converted to digital signals and forwarded to a signal processor 59. Signal processor 59 processes the signal and displays data on a display 60. Signal processor 59, in the course of processing the signal, uses error correction array data, calculated during calibration, to correct measurement data FIG. 3 is a block diagram of a portion of a multi-port test set 22 which illustrates electronic standards directly behind the ports of multi-port test set 22. A switch 61 selects an interface from one of test set ports 31, 32, 33, 34, 35, 36, 37, 38, 38, 40, 41 and 42 to be connected to reflection port 28. FIG. 3 shows a line 69 used to connect the interface of test set port 36 to reflection port 28, and a line 71 used to connect the interface of test set port 35 to reflection port 28. Lines 81 are used to connect the interface of other test set ports to reflection port 28. While only four lines are shown, when multi-port test 22 has twelve test set ports, there are actually ten lines in addition to line 69 and line 71.

A switch 62 selects an interface from one of test set ports 31, 32, 33, 34, 35, 36, 37, 38, 38, 40, 41 and 42 to be connected to transmission port 29. FIG. 3 shows a line 70 used to connect the interface of test set port 36 to transmission port 29, and a line 72 used to connect the interface of test set port 35 to transmission port 29. Lines 82 are used to connect the interface of other test set ports to transmission port 29. While only four lines are shown, when multi-port test 22 has twelve test set ports, there are actually ten lines in addition to line 70 and line 72.

A switch 68 selects whether the interface of test set port 36 is connected to line 69 or line 70. A switch 67 selects whether the interface is selected to test set port 36 or to an open 76, a short 75, a load 80 or a calibration-through line 73. Open 76, short 75, load 80 and calibration-through line 73 are used as internal standards for electronic calibration involving test set port 36. Open 76, short 75 and load 80 are reflection standards which allow solution for directivity, source match and reflection racking. Calibration-through line 73 allows solution for transmission racking. A switch 66 selects whether test set port 36 is activated or connected to a load 79.

A switch 63 selects whether the interface of test set port 35 is connected to line 71 or line 72. A switch 64 selects whether the interface is selected to test set port 35 or to an open 74, short 83, a load 77 or a calibration-through line 73. Open 74, short 83, load 77 and calibration-through line 73 are used as internal standards for electronic calibration involving test set port 35. Open 74, short 83 and load 77 are reflection standards which allow solution for directivity, source match and reflection tracking. Calibration-through line 73 allows solution for transmission tracking. A switch 65 selects whether test set port 35 is activated or connected to a load 78.

Multi-port test set 22 allows for electronic calibration. For reflection measurements, a one-port calibration is used. Measurements of three calibration standards are needed to determine the reflection error coefficients directivity (DIR), source match (SM) and reflection tracking (RT). These three coefficients are used to express the measured data (R_RAW) in terms of the actual data (R_COR) in accordance with Equation 1 below:

$$R\_RAW = DIR + \frac{R\_COR \times RT}{1 - (SM \times R\_COR)} \qquad \text{Equation 1}$$

In order to solve for the three coefficients, measurements of three known quantities are made. The three known quantities may be any quantities. In the preferred embodiment, an open, a short and a load are used. What is meant by an open is a circuit which approximates an open circuit. What is meant by a short is a circuit which approximates a short circuit. What is meant by a load is a circuit which approximates a circuit with a reflection coefficient of zero.

Thus each test set port interface includes circuits approximating an open, short and load. For example, for test set port 36, open 76 is used for the open, short 75 is used for the short and load 80 is used for the load. For example, for test set port 35, open 74 is used for the open, short 83 is used for the short and load 77 is used for the load. An open, short and load were used for ease of circuit implementation, but any three standards could be used as long as they each present impedances that are substantially different. For more information on generating the coefficients, see *HP8753D Network Analyzer User's Guide*, Part No. 08753-90257, available from Hewlett-Packard Company, September, 1995, pp. 6-37 through 6-44.

For transmission measurements, an enhanced response calibration (correcting source match and frequency response) is used. The test set ports are divided into pairs, with a calibration-through path that can be switched between pairs. The calibration-through path provides the transmission path for self-calibration. For example, calibration-through line 73 serves as a calibration through path for the pair of test set port 35 and test set port 36.

In calculating actual data (T_COR) for transmission, reflection error coefficient source match (SM) and a transmission error coefficient transmission tracking (TT) are used to modify actual tracking (measured) data (T_RAW) in accordance with Equation 2 below:

$$T\_COR = \frac{T\_RAW}{TT \times (1 - SM \times R\_COR)} \quad \text{Equation 2}$$

The reflection error coefficient source match (SM) is calculated when solving Equation 1, so that only one measurement is needed to solve for the one transmission error coefficient transmission tracking (TT).

In the preferred embodiment, before performing automatic calibration, an initial calibration is made. The first part of the initial calibration is to perform a measurement calibration with a known set of standards. Three reflection measurements and one transmission measurement is made in order to generate values for the three reflection error coefficients and the one transmission error coefficient. The measurement calibration can be at any reference plane in any connector type for which a calibration kit definition can be provided. Generally for the measurement calibration, calibration standards are used which are placed between multi-port test set 22 and DUT 23 and are in a plane which is as close to DUT 23 as possible. As mentioned above, the measurement calibration yields values for the reflection error coefficients directivity (DIR), source match (SM) and reflection tracking(RT) and the transmission error coefficient transmission tracking (TT).

The electronic standards internal (i.e., open, short, load and through) to the test set are measured and the resulting corrected terms (R_COR and T_COR) are calculated for each of the electronic standards using the coefficients from the measurement calibration. Since the internal electronic standards (i.e., for open, short and load) are behind the calibration reference plane, they will show a negative electrical delay. Highly reflective standards (i.e. open and short) may show a reflection coefficient magnitude greater than one. For reflection measurements, only the three reflection standards (i.e. open, short and load) are measured, and the value of R_COR for each reflection standard is saved for future automatic calibrations. For transmission measurements, the calibration-through is also measured and the resulting value of T_COR is saved. The stored values of R_COR and T_COR are used for subsequent automatic calibrations. Since the electronic standards are designed to be simple and very stable, the initial calibration (which includes the measurement calibration) only needs to be repeated at infrequent intervals, for example monthly.

Drift of the hardware in network analyzer 21 and multi-port test set 22 causes a loss of measurement accuracy. On a periodic basis, for example, during every half hour of use, an automatic recalibration is performed to restore the initial accuracy of the calibrated system.

Automatic re-calibrations are performed using the initial corrected electronic standards (R_COR and T_COR) calculated in the initial calibration. When performing the automatic recalibration, R_RAW is measured for each of the three reflection standards and the stored values of R_COR (one of the initial corrected electronic standards) for each reflection standard is used to re-calculate the three reflection error coefficients directivity (DIR), source match (SM) and reflection tracking(RT). Also T_RAW is measured and the stored value of T_COR (one of the initial corrected electronic standards) is used to re-calculate the transmission error coefficient transmission tracking (TT).

Figure 4:
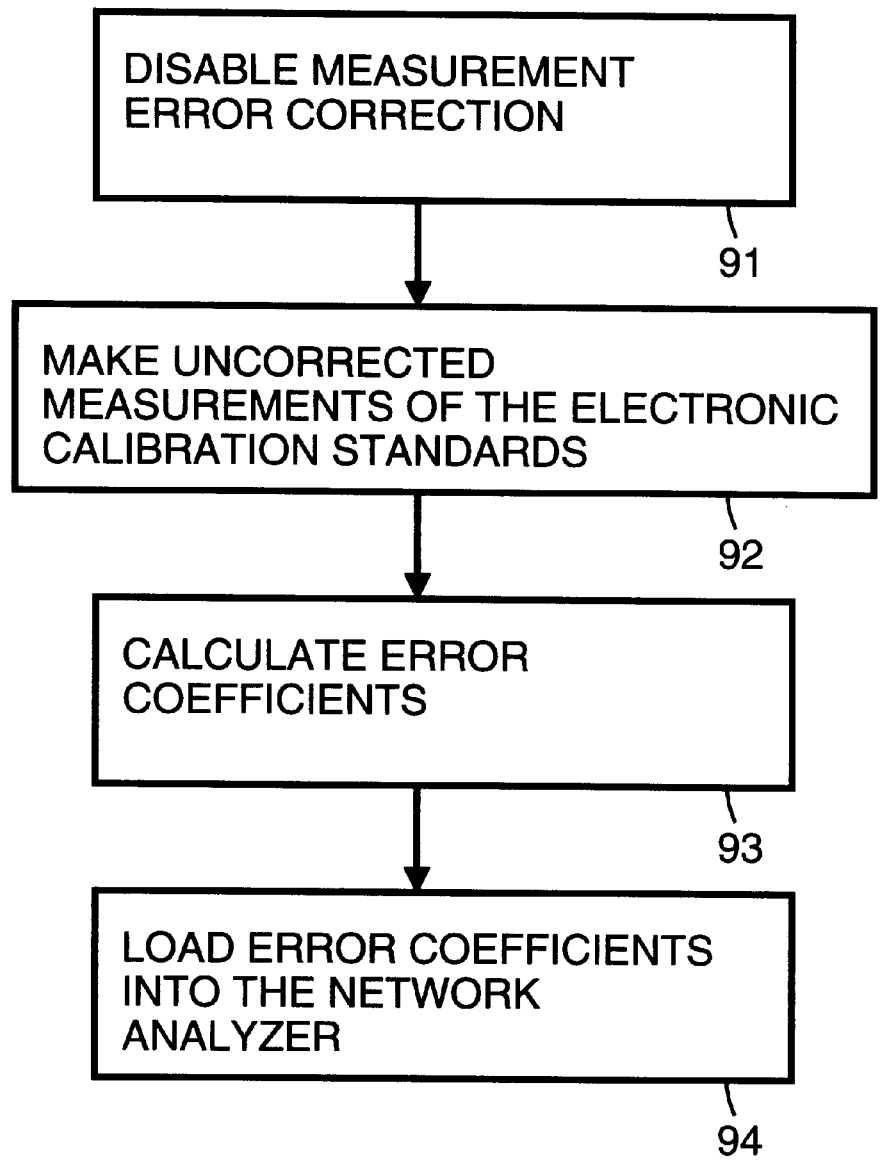
FIG. 4 is a flowchart which illustrates automatic re-calibration in accordance with the preferred embodiment of the present invention.

Automatic re-calibration, as described above, is illustrated in FIG. 4. In a step 91, measurement error correction is disabled in network analyzer 21. In a step 92, uncorrected measurements of the electronic calibration standards are made. For reflection measurements the three reflection standards are measured. For transmission measurements, the calibration through path is also measured.

In a step 93, error coefficient arrays are calculated from the measurements made in step 92. The error coefficient arrays that are calculated are those which would yield corrected measurements of the internal standards that are identical to those from the initial calibration. Measurements of the three reflection standards along with the initial corrected electronic standards allow solution for directivity, source match and reflection tracking. A measurement of the calibration-through transmission standard along with the initial corrected electronic standards allows solution for transmission tracking.

In a step 94, the calculated error coefficients are loaded into network analyzer 21 for future error correction for subsequent measurements.

After the automatic re-calibration, corrected measurements of the internal standards will be identical to those from the initial calibration. The automatic re-calibration allows removal of the measurement drift of the reflectometer within network analyzer 21 and all hardware in the test set signal path within multi-port test set 22 up to the location of the internal standards used for the calibrations. The only sources of drift in the signal path that can not be removed are the drift of the internal standards themselves, and the cables, connectors and fixturing which occur in the signal path after the standards within multi-port test set 22.

The above has described calibration of a radio frequency network analyzer system which includes a multi-port test set. For a network analyzer system which does not include a multi-port test set, the electronic standards are moved within network analyzer 21 behind RF out port 24 and RF in port 25. In this case, the initial calibration and automatic re-calibration described are performed using out port 24 and RF in port 25. In this case, out port 24 and RF in port 25 are the test ports of the network analyzer system.

A complete transmission calibration with a twelve-port test set would normally require the characterization of all 132 possible transmission paths. The time this calibration requires makes it unsuitable for high throughput manufacturing. This forces manufacturers to reduce their testing to the absolute minimum number of transmission paths. This reduces the calibration time, but for a large multi-port device the number of paths could still be quite large.

In order to perform an automatic calibration on all 132 possible paths of a 12 port test set would require a calibration matrix that could provide any of the 132 possible paths. Such a matrix would be very complex and even larger than the twelve 12-way switch matrices designed into the switching test set. This would make the calibration matrix less stable than the test set. Therefore, for the preferred embodiment of the present invention, a different approach is used.

Specifically, the transmission response signal path is broken into six parts. The first part of the path resides within network analyzer 21. The second part of the path is from RF out port 24 of network analyzer 21 to reflection port 28. The third part of the path is the cabling and test set switches which route the RF signal from reflection port 28 to test set port 31. The fourth part is the customer cabling and fixturing from test set port 31 to test set port 36. The fifth part of the path is the cabling and test set switches which route the RF signal from test set port 36 to transmission port 29. The sixth part of the path is from transmission port 29 back to RF in port 25 of network analyzer 21.

When performing a transmission measurement between a pair of test set ports which have a calibration-through path, the calibration-through line for the pair can be used. For example, when performing a transmission measurement between test set port 35 and test set port 36, switch 67 connects to calibration-through line 73 and switch 64 connects to calibration-through line 73 providing a calibration-through path.

For the case where a transmission measurement is made between ports that do not have a calibration-through path between them (i.e., they are not "pairs") reflection measurements of the standards behind the reflection and pair ports, and a transmission measurement of the calibration-through path between the pair port and the transmission port are made. It is then possible to mathematically separate the transmission signal path responses and perform automatic calibrations between any two ports.

Figure 5:
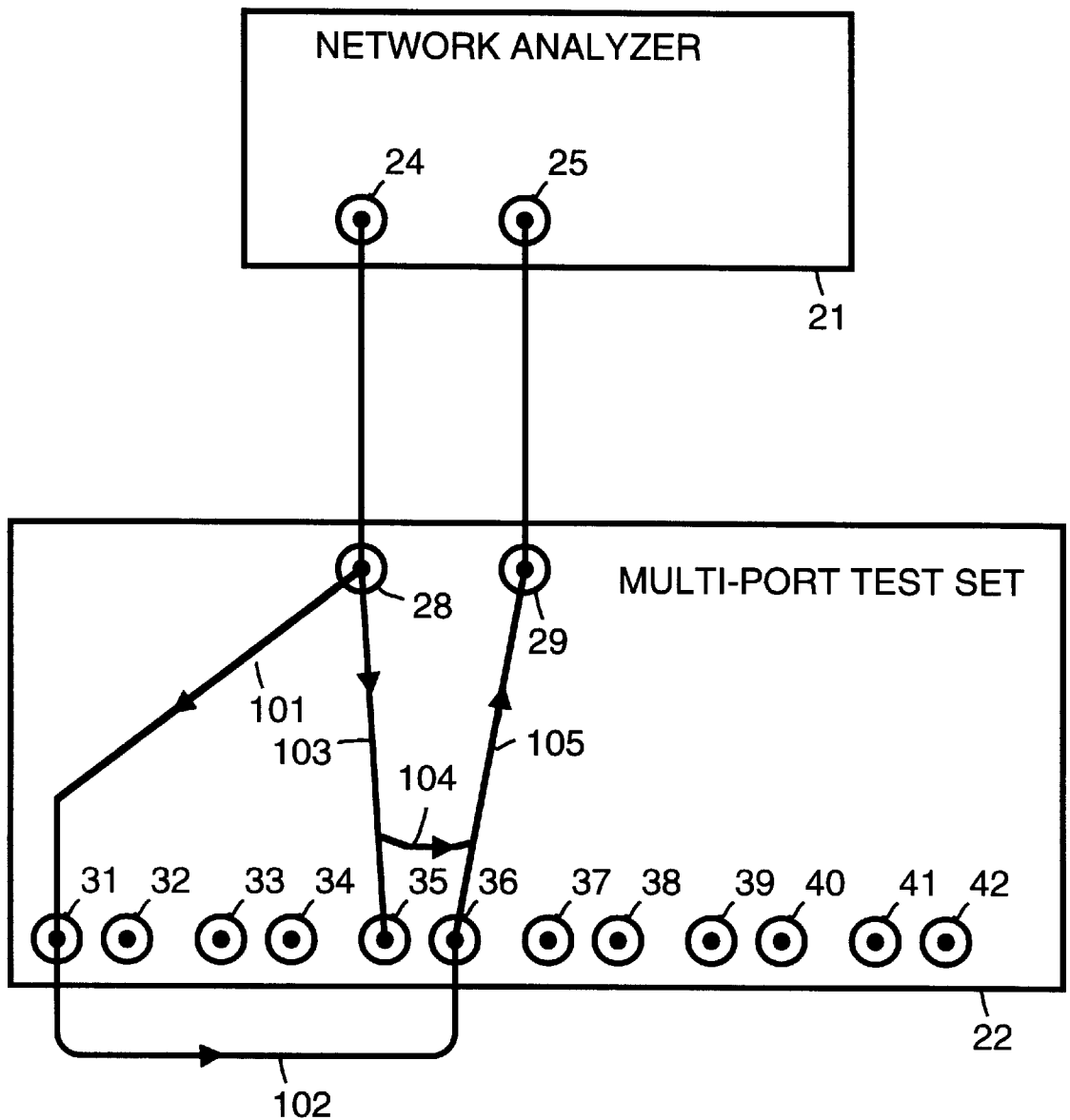
FIG. 5 is simplified block diagram which illustrates calibration-through paths used in automatic calibration in accordance with the preferred embodiment of the present invention.

FIG. 5 illustrates the various components of transmission response for a transmission measurement made between test set ports 31 and 36 that do not have a calibration-through path between them. The network analyzer transmission response (T_NA) is the transmission response through network analyzer 21. The reflection port transmission response (T_REFL) is the transmission response along a path 101 from reflection port 28 to test set port 31 (the reflection port). The transmission response of a fixtures and cables (T_CUST) is the transmission response along a path 102 between test set port 31 and test set port 36

The pair port transmission response (T_PAIR) is the transmission response along a path 103 from reflection port 28 to test set port 35 (the pair port). The transmission port transmission response (T_TRAN) is the transmission response along a path 105 from test set port 36 (the transmission port) to transmission port 29. The calibration-through transmission response (T_CALTHRU) is the transmission response along a path 104 from test set port 35 to test set port 36. Path 10 is the electronic through calibration standard (also called a through line).

Figure 6:
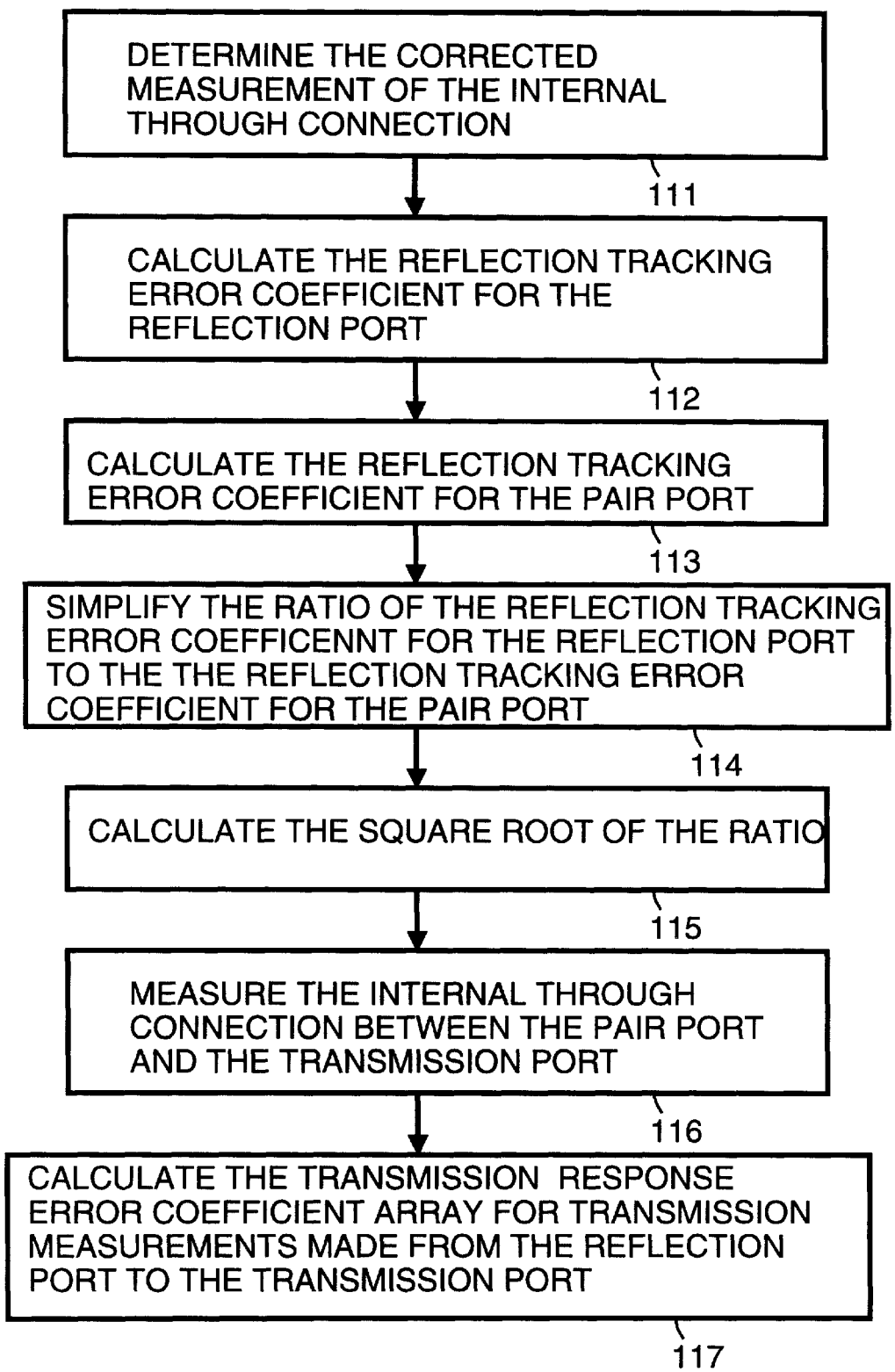
FIG. 6 is a flowchart which illustrates separation of transmission signal path responses and performance of automatic calibrations for two ports for which there is no calibration-through path in accordance with the preferred embodiment of the present invention.

FIG. 6 is a flowchart which illustrates separation of transmission signal path responses and performance of automatic calibrations for two ports for which there is no calibration-through path in accordance with the preferred embodiment of the present invention.

In a step 111, a transmission response calibration is performed between the pair port and the transmission port. Typically this step is performed before the automatic calibration during the initial calibration. During this calibration, the internal calibration-through path is measured between test set port 35 and test set port 36.

As a result of this calibration, the corrected measurement of the internal calibration-through path (T_COR), is calculated as the ratio of the uncorrected measurement of the internal calibration-through path (T_RAW) as made by network analyzer 21 over the transmission response error coefficient term (TT) from the initial calibration. The uncorrected measurement of the internal calibration-through path (T_RAW) and the transmission response error coefficient term (TT) are given in terms of the network analyzer transmission response (T_NA), the transmission response of fixtures and cables (T_CUST), pair port transmission response (T_PAIR), the transmission port transmission response (T_TRAN) and the calibration-through transmission response (T_CALTHRU), as defined above. This is set out in Equation 3 below:

$$T\_COR = \frac{T\_RAW}{TT} =$$ Equation 3

$$\frac{T\_NA \times T\_PAIR \times T\_CALTHRU \times T\_TRAN}{T\_NA \times T\_PAIR \times T\_CUST \times T\_TRAN} = \frac{T\_CALTHRU}{T\_CUST}$$

The ratio $$\frac{T\_CALTHRU}{T\_CUST}$$

for each pair in each direction is saved and is used to mathematically convert transmission measurements through the internal calibration-through path into measurements through cables and fixtures connected to the corresponding test set ports of multi-port test set 22.

In a step 112, the reflection tracking error coefficient (RT_Refl) for test set port 31 (the reflection port) is calculated from the measurements of the three reflection standards behind test set port 31 and the results of the initial calibration. In terms of the reflection response (R_NA) of network analyzer 21 and the reflection port transmission response (T_REFL) defined above, the reflection tracking error coefficient (RT_Refl) is expressed as in Equation 4 below:

$$RT\_Refl = R\_NA \times (T\_REFL)^2$$ Equation 4

In Equation 4, $(T\_REFL)^2$ is the two-way loss from reflection port 28 to test set port 31 and back to reflection port 28.

In a step 113, the reflection tracking error coefficient (RT_Pair) for test set port 35 (the pair port) is calculated from the measurements of the three reflection standards behind test set port 35 and the results of the initial calibration. In terms of the reflection response (R_NA) of network analyzer 21 and the pair port transmission response (T_Pair), defined above, the reflection tracking error coefficient (RT_Pair) for test set port 35 is expressed as in Equation 5 below:

$$RT\_Pair = R\_NA \times (T\_PAIR)^2$$ Equation 5

In Equation 5, $(T\_PAIR)^2$ is the two-way loss from reflection port 28 to test set port 35 and back to reflection port 28.

In a step 114, the ratio of the reflection tracking error coefficient (RT_Refl) of test set port 31 to the reflection tracking error coefficient (RT_Pair) for test set port 35 is simplified as in Equation 6 below:

$$\frac{RT\_Refl}{RT\_Pair} = \frac{R\_NA \times (T\_REFL)^2}{R\_NA \times (T\_PAIR)^2} = \frac{(T\_REFL)^2}{(T\_PAIR)^2}$$ Equation 6

Since the reflection response (R_NA) of network analyzer 21 is common to both the reflection tracking error coefficient (RT_Refl) of test set port 31 and the reflection tracking error coefficient (RT_Pair) for test set port 35 this term is canceled out.

In a step 115, the square root of the ratio is taken, as shown in Equation 7 below.

$$\sqrt{\frac{RT\_Refl}{RT\_Pair}} = \sqrt{\frac{(T\_REFL)^2}{(T\_PAIR)^2}} = \frac{T\_REFL}{T\_PAIR} \qquad \text{Equation 7}$$

When taking the square root, the correct sign must be chosen. Since the quantity in the square root is just the ratio of two insertion losses, the sign that gives the most constant group delay is chosen. In the preferred embodiment, the design of the test set ports is nearly identical, so the group delay of the ratio of the losses should be very close to zero. Group delay is the rate of change of the phase with respect to frequency. The sign is chosen so that the phase of the ratio changes as little as possible between successive frequency measurement points. Once the ratio of the losses through the reflection and pair ports has been determined, transmission measurements made through the pair port can be mathematically converted into measurements through the reflection port simply by multiplying by this ratio.

In a step 116, the vector error correction in network analyzer 21 is turned off. The internal calibration-through path transmission value (T_SELFCAL) is as set out in Equation 8:

$$T\_SELFCAL = T\_NA \times T\_PAIR \times T\_CALTHRU \times T\_TRAN \qquad \text{Equation 8}$$

In a step 117, the internal calibration-through path transmission value (T_SELFCAL) is multiplied by the ratio, $$\frac{T\_REFL}{T\_PAIR},$$

calculated in step 114 and the ratio $$\frac{T\_CALTHRU}{T\_CUST},$$

calculated in step 111, as set out in Equation 9 below:

$$T\_SELFCAL \times \frac{T\_REFL}{T\_PAIR} \times \frac{T\_CUST}{T\_CALTHRU} = \qquad \text{Equation 9}$$
$$T\_NA \times T\_PAIR \times T\_CALTHRU \times T\_TRAN \times$$
$$\frac{T\_REFL}{T\_PAIR} \times \frac{T\_CUST}{T\_CALTHRU} =$$
$$T\_NA \times T\_REFL \times T\_CUST \times T\_TRAN$$

This is the transmission response error coefficient array for transmission measurements made from test set port 31 (the reflection port) to test set 36 (the transmission). This quantity is determined by the above-described automatic calibration algorithm without disconnecting the device under test and without actually making a transmission measurement between test set port 31 and test set 36.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for performing calibration of a network analyzer system, the method comprising the following steps:

(a) performing an initial calibration for test ports of the network analyzer system comprising the following substeps:

(a.1) performing a measurement calibration using calibration standards, the calibration standards being located in a reference plane located outside the network analyzer system, the measurement calibration yielding initial calibration coefficients, (a.2) measuring electronic standards within the network analyzer system to produce initial measured electronic standards, and (a.3) using the initial calibration coefficients and the measured electronic standards to generate initial corrected electronic standards; and, (b) performing an automatic recalibration for the test ports, the automatic recalibration being performed after initial calibration of all the test ports in step (a), the automatic recalibration being performed without use of calibration standards located in a reference plane located outside the network analyzer system and the automatic recalibration comprising the following substeps:

(b.1) measuring the electronic standards within the network analyzer system to produce recalibration measured electronic standards, and (b.2) using the recalibration measured electronic standards and the initial corrected electronic standards to produce recalculated calibration coefficients.

2. A method as in claim 1 wherein in substep (a.2) the electronic standards approximate an open, a short and a load.

3. A method as in claim 1 wherein in substep (a.1) the initial calibration coefficients comprise:

three reflection error coefficients: directivity (DIR), source match (SM) and reflection tracking (RT); and, one transmission error coefficient: transmission tracking (TT).

4. A method as in claim 3 wherein in substep (a.1) measured values (R_RAW) for reflection calibration standards are related to corrected values (R_COR) for the reflection calibration standards in accordance with an equation as set out below:

$$R\_RAW = DIR + \frac{R\_COR \times RT}{1 - (SM \times R\_COR)}.$$

5. A method as in claim 3 wherein in substep (a.1) a measured value (T_RAW) for a transmission calibration standard is related to a corrected value (T_COR) for the transmission calibration standard in accordance with an equation as set out below:

$$T\_COR = \frac{T\_RAW}{TT \times (1 - SM \times R\_COR)}.$$

6. A method as in claim 3 wherein in substep (a.3) the initial corrected electronic standards include reflection calibration standards and measured values (R_RAW) for the reflection calibration standards are related to corrected values (R_COR) for the reflection calibration standards in accordance with an equation as set out below:

$$R\_RAW = DIR + \frac{R\_COR \times RT}{1 - (SM \times R\_COR)}.$$

7. A method as in claim 3 wherein in substep (a.3) the initial corrected electronic standards include a transmission calibration standard and a measured value (T_RAW) for the transmission calibration standard is related to a corrected value (T_COR) for the transmission calibration standard in accordance with an equation as set out below:

$$T\_COR = \frac{T\_RAW}{TT \times (1 - SM \times R\_COR)}.$$

8. A method as in claim 1 wherein the network analyzer system includes a network analyzer connected to multi-port test set and the test ports of the network analyzer system are test set ports of the multi-port test set.

9. A method as in claim 8 wherein the test set ports are divided into pairs and substep (a.1) includes the following substep used to generate transmission coefficients for each pair of test set ports:

(a.1.1) determining a first ratio of transmission response of fixtures and cables to calibration through transmission response, wherein the calibration through transmission response is determined using a calibration through line to electrically connect each pair of test set ports and the transmission response of the fixtures and the cables is determined using the fixtures and the cables to electrically connect together each pair of test set ports.

10. A method as in claim 9 wherein when calculating a transmission response error coefficient between a first test set port and a second test set port where the second test set port is paired with a third test set port:

substep (b.1) includes measuring transmission response of an internal calibration through path transmission value between the third test set port and the second test set port; and, substep (b.2) includes multiplying the transmission response of the internal calibration through path transmission value between the third test set port and the second test set port measured in substep (b.1) by the first ratio calculated in substep (a.1.1) for the internal calibration through path transmission value between the third test set port and the second test set port and by a second ratio, the second ratio being the transmission response between a reflection input of the multi-port test set and the first port to the transmission response between the reflection input of the multi-port test set and the third port.

* * * * *